United States Patent
Ipposhi et al.

(10) Patent No.: US 6,380,089 B1
(45) Date of Patent: *Apr. 30, 2002

(54) METHOD OF MANUFACTURING SEMICONDUCTOR DEVICE

(75) Inventors: Takashi Ipposhi; Toshiaki Iwamatsu, both of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/311,360

(22) Filed: May 13, 1999

(30) Foreign Application Priority Data

Dec. 2, 1998 (JP) ............................ 10-342639

(51) Int. Cl.⁷ ............................................. H01L 21/302
(52) U.S. Cl. ...................................... 438/704; 438/745
(58) Field of Search ................... 438/459, 753, 438/756, 751, 750, 749, 745, 704, 706, 710

(56) References Cited

U.S. PATENT DOCUMENTS

| | | | | |
|---|---|---|---|---|
| 5,707,487 A | * | 1/1998 | Hori et al. | 156/659.11 |
| 6,063,300 A | * | 5/2000 | Suzuki et al. | 216/59 |
| 6,103,598 A | * | 8/2000 | Yamgata et al. | 438/459 |

FOREIGN PATENT DOCUMENTS

JP    8-139297    5/1996

OTHER PUBLICATIONS

S. Nakashima, et al. "Sacrificial Oxidation Techniques of Top Si Layer to Reduce Source–to–Drain Leakage Current in 0.25–μm MOSFETS/SIMOX", Proceedings 1996 IEEE International SOI Conference, Oct. 1996, pgs. 124–125.

* cited by examiner

Primary Examiner—Matthew Smith
Assistant Examiner—Calvin Lee
(74) Attorney, Agent, or Firm—Oblon, Spivak, McClelland, Maier & Neustadt, P.C.

(57) ABSTRACT

An SOI layer is thinned without a thermal oxidation process. An SOI substrate (10) is immersed in an etching bath filled with an $NH_3$—$H_2O_2$—$H_2O$ solution to be isotropically etched. This produces a 100-mn thick SOI layer (3) with no crystal defect.

12 Claims, 5 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, especially, a method of manufacturing a semiconductor device formed on an SOI substrate.

2. Description of the Background Art

Semiconductor devices (SOI device) formed on an SOI (Silicon On Insulator) substrate have advantages such as reduced junction capacitance and improved element isolation breakdown voltage, over semiconductor devices (bulk device) formed on a bulk substrate.

FIG. 5 is a cross-sectional view of an SOI substrate 10. The SOI substrate 10 has a structure with a buried oxide film 2 and a single crystalline silicon layer (hereinafter referred to as "SOI layer") 3 stacked on the main surface of a silicon substrate 1. In FIG. 5, the buried oxide film 2 is approximately 370 nm thick, and the SOI layer 3 is approximately 200 nm thick.

At the time of forming the substrate, the thickness of the SOI layer 3 of the SOI substrate 10 is approximately 200 nm as shown in FIG. 5. However, in the manufacture of semiconductor devices, the SOI layer 3 has to be reduced in thickness according to specs of desired semiconductor devices, which is called a thinning process of the SOI layer 3.

As shown in FIG. 6, the SOI layer 3 is thinned to a moderate thickness in a semiconductor element forming region (active region) AR of the main surface of the SOI substrate 10.

When the thickness of the SOI layer required for the manufacture of semiconductor devices is 100 nm, for example, the SOI layer 3 of the SOI substrate 10 has to be reduced by about 100 nm since its original thickness is approximately 200 mn.

Conventionally, techniques for thermally oxidizing the SOI layer 3 have been adopted to make the SOI layer 3 thinner. More specifically, the SOI substrate 10 is heated to about 1000° C. and exposed to an oxygen atmosphere for thermal oxidation so that a 220-nm thick thermal oxide film 4 is formed on the SOI layer 3 as shown in FIG. 7. This consumes about 100 nm of silicon which forms the SOI layer 3, thereby reducing the SOI layer 3 to approximately 100 nm.

After the removal of the thermal oxide film 4 with a hydrofluoric acid solution, the SOI layer 3 of the SOI substrate 10 has a thickness of about 100 nm as shown in FIG. 8.

The problem here is surplus silicon (injected silicon interstitial during oxidation), i.e., a phenomena that interstitial silicon atoms occurring in the interface between silicon and a silicon oxide film during thermal oxidation of the SOI layer 3 form crystal defects DF in the SOI layer 3 as shown in FIG. 8. When semiconductor devices are formed in the SOI layer 3 with the crystal defects DF, abnormal leakage current will occur during operation of the devices.

FIG. 9 schematically shows an example that CMOSs (Complementary MOSs) are formed in the thinned SOI layer 3. In FIG. 9, the SOI layer 3 is electrically divided into an NMOS region with a plurality of N-type MOSFETs (N-MOSFETs) 15 and a PMOS region with a plurality of P-type MOSFETs (P-MOSFETs) 25 by an element isolation film 5 formed of an insulating film such as a silicon oxide film.

The N-MOSFET 15 has a P type impurity region 14 with P-type impurities doped into the SOI layer 3; a gate oxide film 11 formed on the P-type impurity region 14; a gate electrode 12 formed on the gate oxide film 11; and source/drain regions 13 with N-type impurities relatively highly doped therein which are formed in the SOI layer 3 to sandwich the P-type impurity region 14 from both sides.

The P-MOSFET 25 has an N-type impurity region 24 with N-type impurities doped into the SOI layer 3; a gate oxide film 21 formed on the N-type impurity region 24; a gate electrode 22 formed on the gate oxide film 21; and source and drain regions with P-type impurities relatively highly doped therein which are formed in the SOI layer 3 to sandwich the N-type impurity region 24 from both sides.

As shown in FIG. 9, MOSFETs including the crystal defects DF are formed in proportion to a crystal defect density in the formation of a plurality of MOSFETs in the SOI layer 3 having the crystal defects DF. This results in characteristic anomalies and malfunction.

FIGS. 8 and 9 only schematically show the crystal defects DF in the SOI layer 3, and actual crystal defects are more complicated. Further, it is difficult to detect the as-is status of crystal defects after the thermal oxidation for thinning the SOI layer, so that the presence of crystal defects is confirmed by manifesting the crystal defects by means of selective etching such as Secco etching.

The Secco etching refers to an etching using an etchant, so called "Secco" or an etching using as an etchant an aqueous solution of a mixture of 0.15-mol potassium dichromate ($K_2Cr_2O_7$) and 48% of hydrofluoric acid (HF) in the ratio of 1:2. This is to manifest crystal defects by using a characteristic that the etching rate in a portion with crystal defects is higher than that in a portion with no crystal defect.

In this fashion, the conventional thinning method of the SOI layer included the thermal oxidation process of the SOI layer, so that it had a problem of causing crystal defects in the SOI layer due to the thermal oxidation.

SUMMARY OF THE INVENTION

A first aspect of the present invention is directed to a method of manufacturing a semiconductor device comprising the steps of: preparing an SOI substrate; isotropically etching an SOI layer of the SOI substrate to a predetermined thickness with an $NH_3$—$H_2O_2$—$H_2O$ solution; and forming semiconductor devices on the thinned SOI layer.

According to a second aspect of the present invention, in the manufacturing method of the first aspect, the ratio of components $NH_3$ and $H_2O_2$ in the $NH_3$—$H_2O_2$—$H_2O$ solution stands at 1:1.

According to a third aspect of the present invention, in the manufacturing method of the second aspect, the ratio of components in the $NH_3$—$H_2O_2$—$H_2O$ stands at 1:1:5 and a temperature of the solution ranges from 50° C. to less than 100° C.

According to a fourth aspect of the present invention, in the manufacturing method of the second aspect, the ratio of components in the $NH_3$—$H_2O_2$—$H_2O$ stands at 1:1:1 and a temperature of the solution ranges from 50° C. to less than 100° C.

A fifth aspect of the present invention is directed to a method of manufacturing a semiconductor device comprising the steps of: preparing an SOI substrate; isotropically etching an SOI layer of the SOI substrate to a predetermined thickness by means of down flow etching, wherein plasma is produced by excitation of a predetermined etching gas by high frequency or microwaves and radicals which are chemically active atoms or molecules included in the plasma are transported to the SOI substrate along a flow of the etching gas to be used as etching species; and forming semiconductor devices on the thinned SOI layer.

According to a sixth aspect of the present invention, in the manufacturing method of the fifth aspect, the etching gas is either of mixed gas of $CF_4$ and $O_2$, mixed gas of $NF_3$ and $O_2$, $Cl_2$ gas, mixed gas of $Cl_2$ and $NF_3$, or $NF_3$ gas.

In the method of manufacturing a semiconductor device of the first aspect, silicon atoms are removed progressively from the surface of the SOI layer since the SOI layer is isotropically etched to a predetermined thickness with the $NH_3$—$H_2O_2$—$H_2O$ solution. Thus, surplus silicon is not produced in the SOI layer, which prevents occurrence of crystal defects in the SOI layer due to surplus silicon. This results in prevention of occurrence of characteristic anomalies or malfunction due to crystal defects when semiconductor devices are formed in the thinned SOI layer.

In the method of manufacturing a semiconductor device of the second aspect, the ratio of components $NH_3$ and $H_2O_2$ in the $NH_3$—$H_2O_2$—$H_2O$ solution stands at 1:1. This prevents surface roughness of the SOI layer.

In the method of manufacturing a semiconductor device of the third aspect, the ratio of components in the $NH_3$—$H_2O_2$—$H_2O$ solution stands at 1:1:5 and the temperature of the solution ranges from 50° C. to less than 100° C. This avoids too low etching rate of the SOI layer and allows controllable etching of the SOI layer.

In the method of manufacturing a semiconductor device of the fourth aspect, the ratio of components in the $NH_3$—$H_2O_2$—$H_2O$ solution stands at 1:1:1 and the temperature of the solution ranges from 50° C. to less than 100° C. This increases the etching rate of the SOI layer as compared to the case where the rate stands at 1:1:5, and also allows controllable etching of the SOI layer.

In the method of manufacturing a semiconductor device of the fifth aspect, silicon atoms are removed progressively from the surface of the SOI layer since the SOI layer is isotropically etched to a predetermined thickness by the down flow etching. Thus, surplus silicon is not produced in the SOI layer, which prevents occurrence of crystal defects in the SOI layer due to surplus silicon. This results in prevention of occurrence of characteristic anomalies or malfunction due to crystal defects when semiconductor devices are formed in the thinned SOI layer. Further the down flow etching uses radicals as etching species, transporting those radicals to the SOI substrate along a flow of etching gas. This prevents the SOI substrate from being exposed to charged particles in plasma, thereby preventing occurrence of crystal defects in the surface of the SOI layer due to ion bombardment.

The method of manufacturing a semiconductor device of the sixth aspect allows effective etching of the SOI layer.

Thus, an objective of the present invention is to achieve a method for thinning an SOI layer without using a thermal oxidation process.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment

Figure 1:
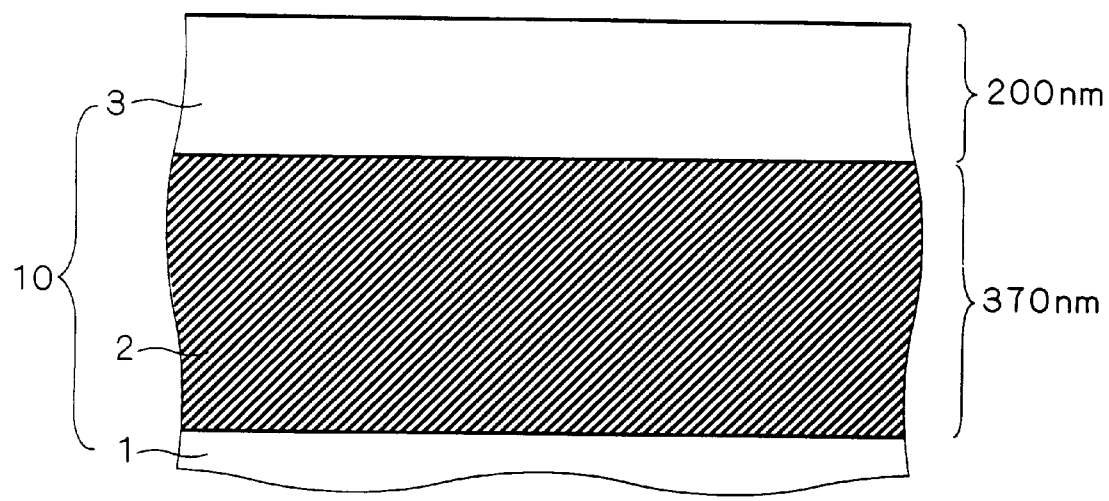
FIGS. 1 through 3 are diagrammatic illustrations of a method of manufacturing a semiconductor device according to a first preferred embodiment of the present invention.
Figure 2:
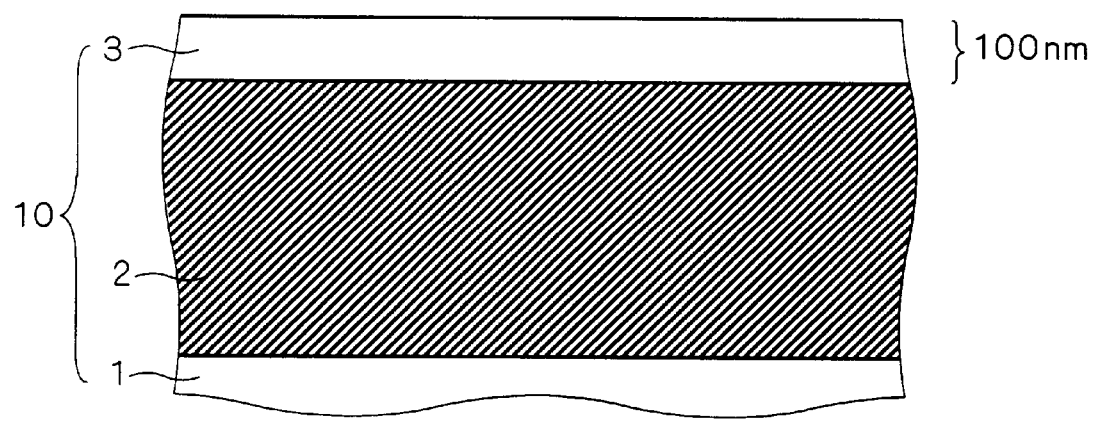
Figure 3:
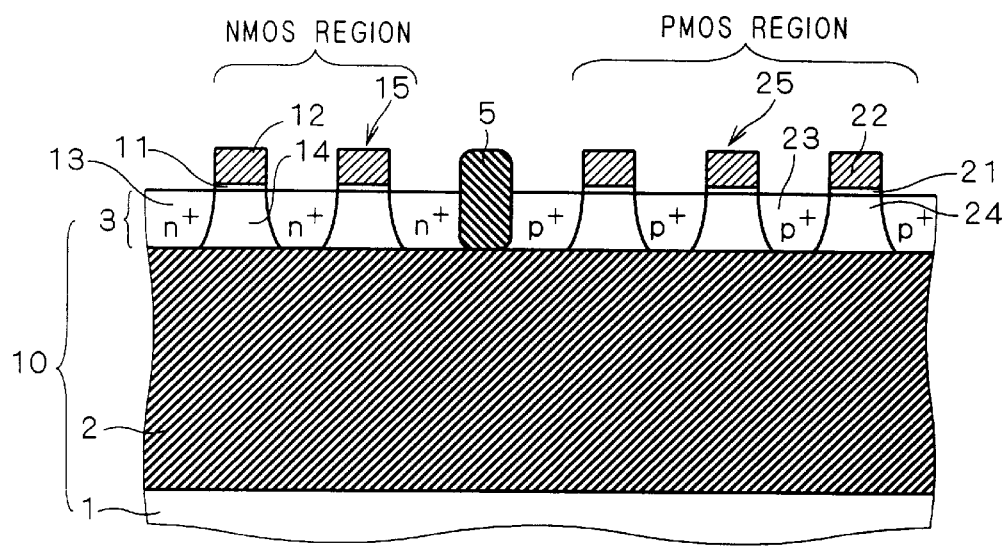

Referring to FIGS. 1 through 3, we will now describe a method of manufacturing a semiconductor device according to a first preferred embodiment of the present invention.

FIG. 1 is a cross-sectional view of an SOI substrate 10. The SOI substrate 10 has a structure with a buried oxide film 2 and a single crystalline silicon layer (hereinafter referred to as "SOI layer") stacked on the main surface of a silicon substrate 1. In FIG. 1, the buried oxide film 2 is approximately 370 nm thick, and the SOI layer 3 is approximately 200 nm thick.

When the thickness of the SOI layer required for the manufacture of semiconductor devices is 100 nm, for example, the SOI layer 3 has to be reduced by about 100 nm. This requires that the SOI substrate 10 be isotropically etched by so-called wet etching using as an etchant an aqueous solution of a mixture of aqua ammonia and hydrogen peroxide water, namely, $NH_3$—$H_2O_2$—$H_2O$ solution.

More specifically, the SOI substrate 10 is immersed in an etching bath filled with the $NH_3$—$H_2O_2$—$H_2O$ solution to be isotropically etched. At this time, a dip method is adopted to circulate the $NH_3$—$H_2O_2$—$H_2O$ solution in the bath. After the etching processing, the SOI substrate is cleaned with running water.

Here we set the ratio of components in the $NH_3$—$H_2O_2$—$H_2O$ solution at 1:1:5 and the temperature of the solution at 50° C. or over. This solution is produced, for example, from aqua ammonia containing 30 wt % of ammonia and hydrogen peroxide water containing 30 wt % of hydrogen peroxide.

FIG. 2 shows the SOI substrate 10 with the 100-nm thick SOI layer 3 thinned by the isotropic etching. The SOI layer 3 in FIG. 2 has no crystal defect. This is because the isotropic etching using the $NH_3$—$H_2O_2$—$H_2O$ solution as an etchant removes silicon atoms progressively from the surface of the SOI layer 3, instead of consuming silicon atoms by thermal oxidization of the SOI layer 3 as in the conventional techniques. This method does not produce surplus silicon in the SOI layer 3, thereby preventing occurrence of crystal defects in the SOI layer 3 due to surplus silicon.

When the $NH_3$—$H_2O_2$—$H_2O$ solution having the aforementioned ratio is used as an etchant, the etching rate R (Å/min) of silicon, i.e., the SOI layer, can be expressed by:

$$R = 1.49 \times 10^{18} \exp\left(\frac{-1.21}{kT}\right) \quad (1)$$

In Equation (1), k is Boltzman's constant and T is the absolute temperature of the solution. For the solution temperature of 50° C., the etching rate is approximately 0.2 Å/min. When the etching rate may be less than 0.2 Å/min, it is needless to say that etching may be performed at a solution temperature of less than 50° C.

To shorten time for the etching processing, the etching rate needs to be increased. There are two techniques for this: a technique for increasing the solution temperature; and a technique for varying the ratio of components in the solution.

According to the technique for increasing the solution temperature, when the solution temperature is set at 80° C., the etching rate is approximately 8 Å/min from Equation (1). Thus, etching the 100-nm (i.e., 1000 Å) SOI layer requires the processing time of about 125 minutes. This 125-minute etching processing may be performed at a time, but may be divided and not performed at one time.

According to the technique for varying the ratio of components in the solution, the etching rate is increased by increasing the ratios of $NH_3$ and $H_{2O2}$ to $H_2O$ while maintaining the $NH_3$—$H_2O_2$ ratio of 1:1. That is, the ratio of components in the $NH_3$—$H_2O_2$—$H_2O$ solution is set at 1:1:1 and the temperature of the solution is set at 80° C. The etching rate in this case is approximately 40 Å/min, so etching the 100-nm SOI layer requires the processing time of about 25 minutes.

It is also possible to increase the ratio of $NH_3$ to $H_2O_2$ larger than 1:1 to increase the etching rate, but this may cause surface roughness of the SOI layer. To prevent this, the ratio between $H_2O_2$ and $NH_3$ should preferably be 1:1. In other words, surface roughness of the SOI layer can be effectively prevented by increasing the ratio of $H_2O_2$ to $NH_3$. If the surface roughness of the SOI layer especially turns into problems, the ratio of $NH_3$ to $H_2O_2$ may be set to be less than 1 after understanding of reduction in etching rate.

At either of the ratios of components in the $NH_3$—$H_2O_2$—$H_2O$ solution: 1:1:5 and 1:1:1, the etching rate can be increased by further increasing the solution temperature. The increase in the solution temperature, however, accelerates evaporation of $H_2O$ and increases deterioration of the solution components with time, causing difficulty in controlling the amount of etching of the SOI layer. Thus, the solution temperature should preferably be 50° C. or over and at least less than 100° C.

FIG. 3 schematically shows an example that CMOSs are formed in the thinned SOI layer 3. In FIG. 3, the SOI layer 3 is electrically divided into an NMOS region with a plurality of N-MOSFETs 15 and a PMOS region with a plurality of P-MOSFETs 25 by an element isolation film 5 formed of an insulating film such as a silicon oxide film.

The N-MOSFET 15 has a P-type impurity region 14 with P-type impurities doped in the SOI layer 3; a gate oxide film 11 formed on the P-type impurity region 14; a gate electrode 12 formed on the gate oxide film 11; source/drain regions 13 with N-type impurities relatively highly doped therein which are formed in the SOI layer 3 to sandwich the P-type impurity region 14 from both sides.

The P-MOSFET 25 has an N-type impurity region 24 with N-type impurities doped in the SOI layer 3; a gate oxide film 21 formed on the N-type impurity region 24; a gate electrode 22 formed on the gate oxide film 21; and source/drain regions 23 with P-type impurities relatively highly doped therein which are formed in the SOI layer 3 to sandwich the N-type impurity region 24 from both sides.

Since the SOI layer 3 has no crystal defect as shown in FIG. 3, no characteristic anomaly or malfunction occurs due to crystal defects.

Characteristic Effect

According to the aforementioned first preferred embodiment of the present invention, the SOI layer is thinned by removing silicon atoms progressively from the surface by isotropic etching using the $NH_3$—$H_2O_2$—$H_2O$ solution as an etchant. Thus, surplus silicon is not produced in the SOI layer, which prevents the occurrence of crystal defects in the SOI layer due to surplus silicon. This results in prevention of characteristic anomalies or malfunction due to crystal defects when semiconductor devices are formed in the thinned SOI layer.

Further, the above thinning process of the SOI layer is performed at low temperatures from 50° C. to less than 100° C. at which thermal oxidation hardly proceeds. Thus, the SOI substrate is not heated to 1000° C. or over unlike the conventional SOI substrate. This avoids the problem of causing crystal defects by thermal stress of the SOI substrate.

Furthermore, the $NH_3$—$H_2O_2$—$H_2O$ solution is usually used to clean silicon substrates, which especially has the effect of removing particles. Accordingly, particles stuck to the SOI substrate can also be removed.

Modification

While the isotropic etching uses the $NH_3$—$H_2O_2$—$H_2O$ solution as an etchant to thin the SOI layer in the first preferred embodiment, the etchant may be a sodium hydroxide (NaOH) solution or a potassium hydroxide (KOH) solution.

The sodium hydroxide solution and the potassium hydroxide solution are characterized by easy handling and no need of heating because of its high etching rate even at room temperature.

For instance, the etching rate of the sodium hydroxide solution with a weight concentration of about 15% is approximately 100 nm/min at a temperature of 60° C.; and the etching rate of the potassium hydroxide solution with a weight concentration of about 20% is approximately 100 nm/min at a temperature of 60° C.

2. Second Preferred Embodiment

In the method of manufacturing a semiconductor device according to the first preferred embodiment of the present invention, the SOI layer is isotropically etched by wet etching in the thinning process, but the SOI layer may be thinned by dry etching. In a method of manufacturing a semiconductor device according to a second preferred embodiment of the present invention, the SOI layer is thinned by chemical dry etching using plasma, especially, by down flow etching.

The chemical dry etching with plasma uses, as etching species, excited-state atoms or molecules (hereinafter referred to as "radicals") which are chemically active and produced in plasma excited by high frequency or microwaves.

Figure 4:
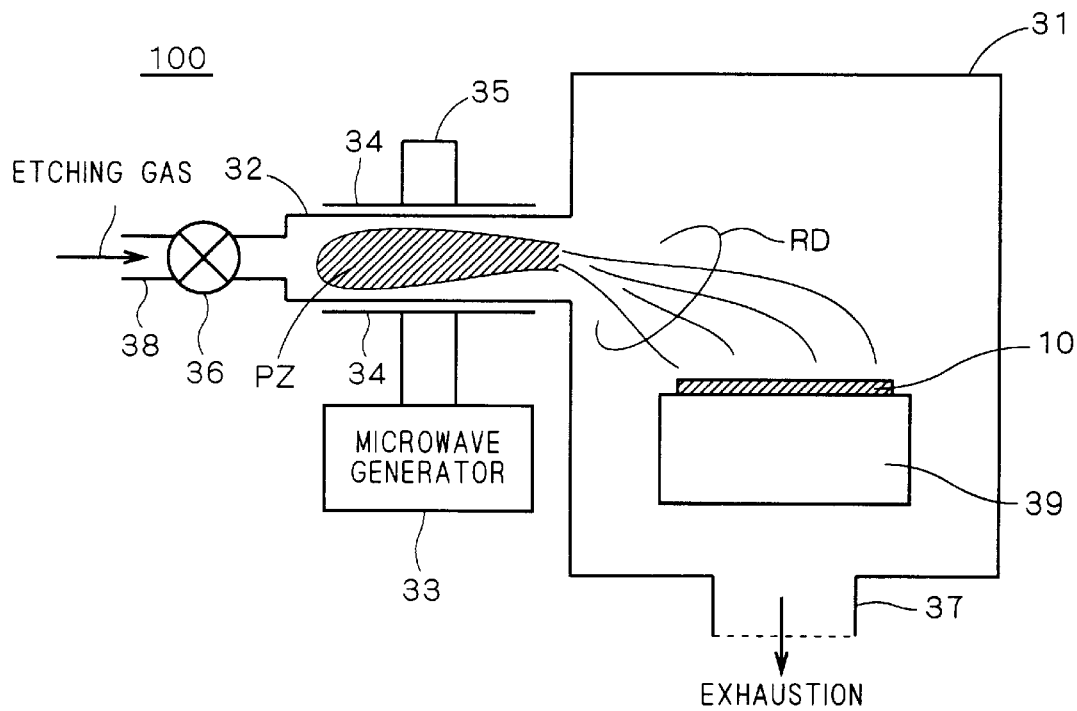
FIG. 4 is a diagrammatic illustration of a method of manufacturing a semiconductor device according to a second preferred embodiment of the present invention.
Figure 5:
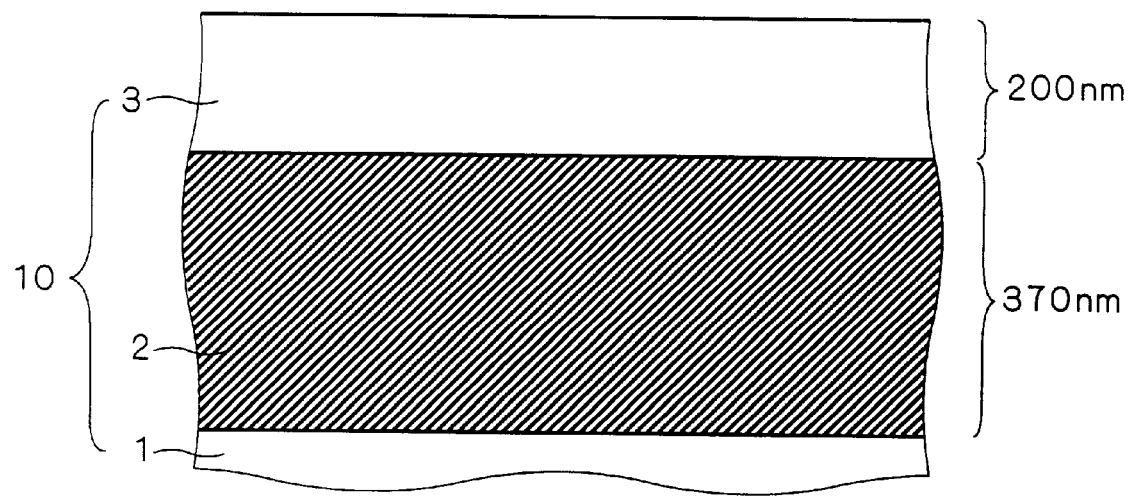
FIGS. 5 and 7 through 9 are diagrammatic illustrations of a conventional method of manufacturing a semiconductor device.
Figure 6:
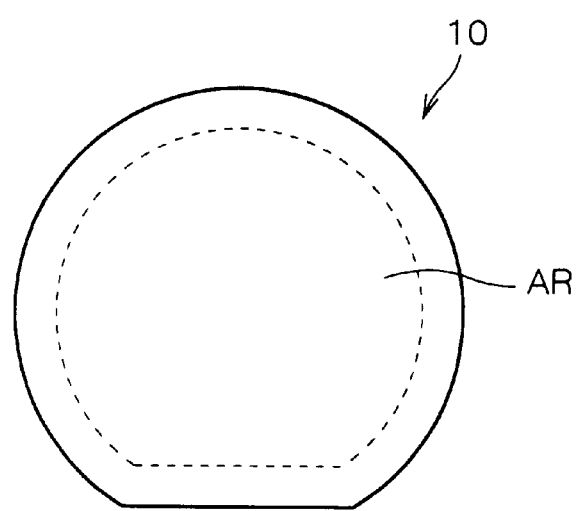
FIG. 6 is a diagrammatic illustration of an active region of a semiconductor device.
Figure 7:
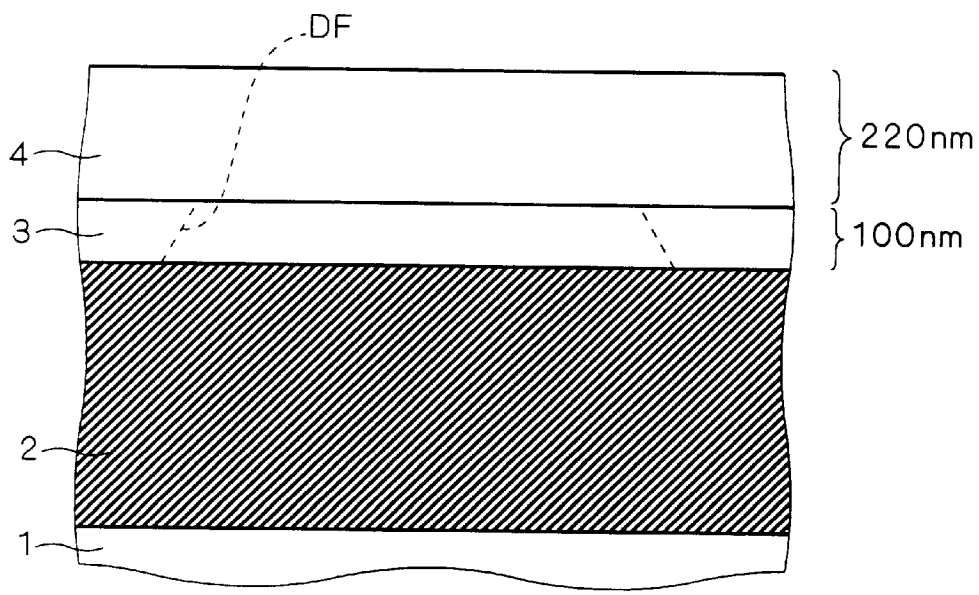
Figure 8:
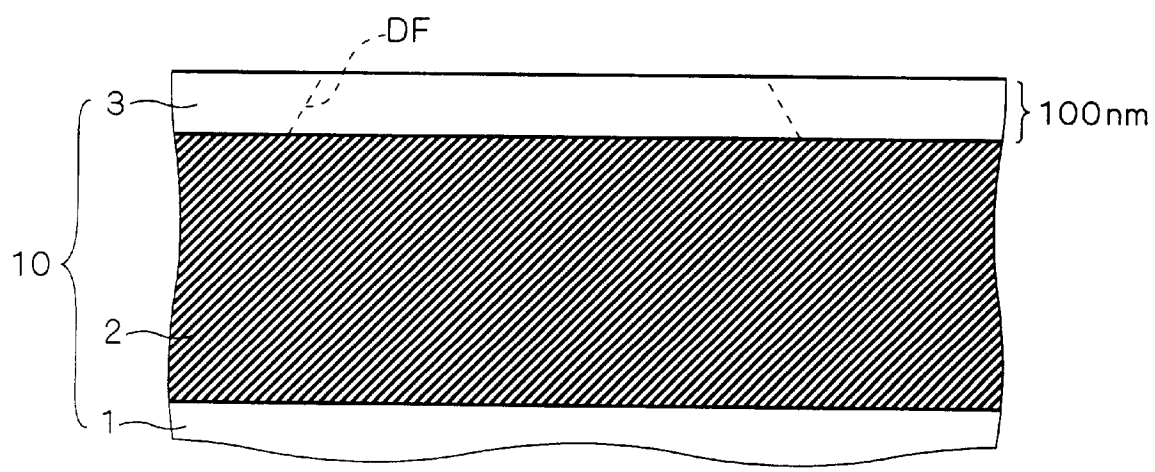
Figure 9:
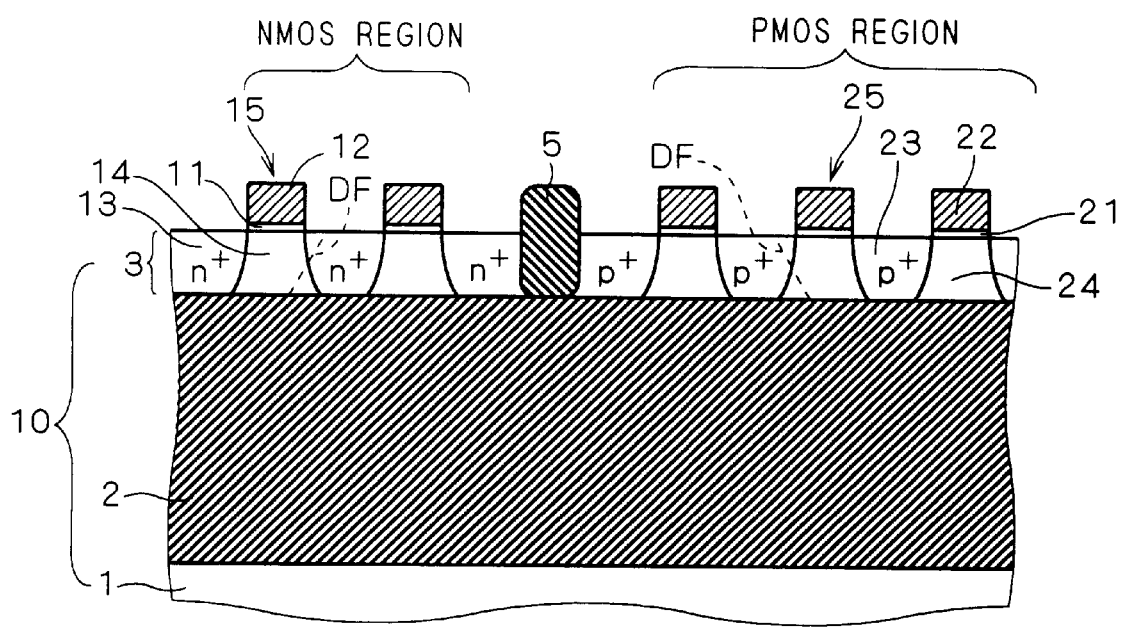

FIG. 4 is a layout sketch of a down flow etcher 100 which performs down flow etching. As shown in FIG. 4, the down flow etcher 100 mainly comprises an etching chamber 31 for accommodating the SOI substrate 10 to be etched; a plasma production chamber 32 connected to the etching chamber 31; a microwave generator 33 for plasma production; a wave-guiding channel 35 for guiding microwaves (e.g., 2.45 GHz) outputted from the microwave generator 33 to an electrode plate 34 in the vicinity of the plasma production chamber 32. The microwave generator 33 may be substituted by a high-frequency generator to excite plasma by high frequency.

Next, we will describe operation of the down flow etcher 100. First, the SOI substrate 10 to be etched is placed on a mounting stage 39 in the etching chamber 31 with the SOI layer 3 on the top. Then, a vacuum system (not shown) evacuates air from the etching chamber 31 and the plasma production chamber 32 through an exhaust pipe 37 to produce a vacuum.

After that, a valve 36 of a gas feeding pipe 38 connected to the plasma production chamber 32 is opened to introduce a given amount of etching gas. The etching gas is, for example, mixed gas of $CF_4$ and $O_2$, mixed gas of $NF_3$ and $O_2$, $Cl_2$ gas, mixed gas of $Cl_2$ and $NF_3$, or $NF_3$ gas.

The etching gas introduced into the plasma production chamber 32 is excited by microwaves applied to the electrode plate 34, which produces plasma PZ. Although charged particles (ions and electrons) forming the plasma PZ have a short life, the lifetime of radicals RD is long. Thus, the radicals RD are transported to the etching chamber 31 along a flow of etching gas and then chemically react with the surface of the SOI substrate 10, i.e., silicon atoms of the SOI layer 3 in the etching chamber. Thus, the SOI layer 3 is removed progressively from the surface. The etching rate of the mixed gas of $CF_4$ and $O_2$, for example, ranges from 150 to 200 nm/min.

The down flow etching uses the radicals RD as etching species so that the SOI substrate 10 is not exposed to charged particles in the plasma PZ. This prevents occurrence of crystal defects in the surface of the SOI layer 3 due to ion bombardment.

Characteristic Effect

According to the aforementioned second preferred embodiment of the present invention, the SOI layer is thinned by removing silicon atoms progressively from the surface by down flow etching. Thus, surplus silicon is not produced in the SOI layer, which prevents the occurrence of crystal defects in the SOI layer due to surplus silicon. This results in prevention of characteristic anomalies or malfunction due to crystal defects when semiconductor devices are formed in the thinned SOI layer.

Further, the down flow etching prevents the SOI substrate from being exposed to charged particles in plasma. Thus, no crystal defect is produced in the surface of the SOI layer due to ion bombardment.

Furthermore, in the down flow etching, the SOI substrate is not heated to such temperatures that thermal oxidation proceeds, i.e. 1000° C. or over, unlike the conventional SOI substrate. This avoids the problem of causing crystal defects by thermal stress of the SOI substrate.

While the invention has been described in detail, the foregoing description is in all aspects illustrative and not restrictive. It is understood that numerous other modifications and variations can be devised without departing from the scope of the invention.

We claim:

1. A method of manufacturing a semiconductor device comprising the steps of:

preparing an SOI substrate;

isotropically etching an SOI layer of said SOI substrate to a predetermined thickness with an $NH_3$—$H_2O_2$—$H_2O$ solution; and forming semiconductor devices in said thinned SOI layer.

2. The manufacturing method according to claim 1, wherein the ratio of components $NH_3$ and $H_2O_2$ in said $NH_3$—$H_2O_2$—$H_2O$ solution stands at 1:1.

3. The manufacturing method according to claim 2, wherein the ratio of components in said $NH_3$—$H_2O_2$—$H_2O$ stands at 1:1:5 and a temperature of said solution ranges from 50° C. to less than 100° C.

4. The manufacturing method according to claim 2, wherein the ratio of components in said $NH_3$—$H_2O_2$—$H_2O$ stands at 1:1:1 and a temperature of said solution ranges from 50° C. to less than 100° C.

5. A method of manufacturing a semiconductor device comprising the steps of:

preparing an SOI substrate;

isotropically etching an SOI layer of said SOI substrate to a predetermined thickness by means of down flow dry etching, wherein plasma is produced by excitation of a predetermined etching gas by high frequency or microwaves and radicals which are chemically active atoms or molecules included in said plasma are transported to said SOI substrate along a flow of said etching gas to be used as etching species; and forming semiconductor devices on said thinned SOI layer.

6. The manufacturing method according to claim 5, wherein said etching gas is either of mixed gas of $CF_4$ and $O_2$, mixed gas of $NF_3$ and $O_2$, $Cl_2$ gas, mixed gas of $Cl_2$ and $NF_3$, or $NF_3$ gas.

7. The manufacturing method according to claim 1, wherein a temperature of said $NH_3$—$H_2O_2$—$H_2O$ solution ranges from 50° C. to less than 100°C.

8. The manufacturing method according to claim 1, wherein the rate of $NH_3$ is less than that of $H_2O_2$.

9. The manufacturing method according to claim 8, wherein a temperature of said $NH_3$—$H_2O_2$—$H_2O$ solution ranges from 50° C. to less than 100° C.

10. A method of manufacturing a semiconductor device comprising the steps of:

preparing an SOI substrate;

removing an SOI layer of said SOI substrate to a predetermined thickness by wet etching with a solution containing ammonia, water and hydrogen peroxide to form a thinned SOI layer; and forming a semiconductor device on said thinned SOI layer.

11. The manufacturing method according to claim 10, wherein a temperature of said solution ranges from 50° C. to less than 100° C.

12. The manufacturing method according to claim 10, wherein said wet etching is performed by circulating said solution in an etching bath.

* * * * *